(12) United States Patent
Chen (10) Patent No.: US 10,741,120 B2
(45) Date of Patent: Aug. 11, 2020

(54) AMOLED DISPLAY DEVICE BASED ELVDD POWER SUPPLY METHOD AND POWER SUPPLY APPARATUS, AND DISPLAY DEVICE

(71) Applicant: BOE Technology Group Co., Ltd., Beijing (CN)

(72) Inventor: Yi Chen, Beijing (CN)

(73) Assignee: BOE Technology Group Co, Ltd., Beijing (CN)

( * ) Notice: Subject to any disclaimer, the term of this patent is extended or adjusted under 35 U.S.C. 154(b) by 82 days.

(21) Appl. No.: 15/567,834

(22) PCT Filed: May 19, 2017

(86) PCT No.: PCT/CN2017/085078
§ 371 (c)(1),
(2) Date: Oct. 19, 2017

(87) PCT Pub. No.: WO2017/206735
PCT Pub. Date: Dec. 7, 2017

(65) Prior Publication Data
US 2018/0211591 A1    Jul. 26, 2018

(30) Foreign Application Priority Data

May 31, 2016    (CN) .......................... 2016 1 0378074

(51) Int. Cl.
*G09G 3/3225*    (2016.01)
*H01L 27/32*    (2006.01)
(Continued)

(52) U.S. Cl.
CPC ....... *G09G 3/3225* (2013.01); *H01L 27/3244* (2013.01); *G02F 2203/30* (2013.01);
(Continued)

(58) Field of Classification Search
CPC ......... G09G 2310/0264; G09G 3/3225; G09G 2360/16; G09G 2330/021;
(Continued)

(56) References Cited

U.S. PATENT DOCUMENTS

2008/0252668 A1    10/2008    Chen
2010/0253664 A1*   10/2010    Byun .................. G09G 3/3208
                                                                345/211
(Continued)

FOREIGN PATENT DOCUMENTS

CN    201549184 U    8/2010
CN    102024418 A    4/2011
(Continued)

OTHER PUBLICATIONS

May 13, 2016—(CN) Search Report Appn 201610378074.8 with English Tran.
(Continued)

*Primary Examiner* — Patrick N Edouard
*Assistant Examiner* — Douglas M Wilson
(74) *Attorney, Agent, or Firm* — Banner & Witcoff, Ltd.

(57) ABSTRACT

An AMOLED display device based ELVDD power supply method and power supply apparatus, and a display device are provided. The method includes: acquiring a data signal of each pixel in one frame of image; comparing a gray scale value corresponding to the data signal of each pixel with at least two threshold gray scale values; taking a minimum threshold gray scale value in the threshold gray scale values greater than the gray scale value corresponding to the data signal of each pixel as a target gray scale value of the pixel; and taking a maximum target gray scale value in the target gray scale values of all pixels as a maximum gray scale
(Continued)

value of the one frame of image, and driving the one frame of image by an ELVDD corresponding to the maximum gray scale value.

13 Claims, 6 Drawing Sheets

(51) Int. Cl.
   *G06F 1/3296* (2019.01)
   *G06F 1/32* (2019.01)
(52) U.S. Cl.
   CPC .............. *G06F 1/32* (2013.01); *G06F 1/3296* (2013.01); *G09G 2310/0264* (2013.01); *G09G 2320/0252* (2013.01); *G09G 2360/16* (2013.01)
(58) Field of Classification Search
   CPC .......... G09G 2330/028; H01L 27/3244; G06F 1/3262; G06F 1/3296; H01S 3/10069; G02F 2203/30
   See application file for complete search history.

(56) References Cited

U.S. PATENT DOCUMENTS

| | | | |
|---|---|---|---|
| 2011/0069096 A1 | 3/2011 | Li et al. | |
| 2013/0002736 A1 | 1/2013 | Park | |
| 2014/0152717 A1 | 6/2014 | Seong et al. | |
| 2015/0049070 A1* | 2/2015 | Ren | G09G 3/3233 345/211 |
| 2016/0180763 A1* | 6/2016 | Park | G09G 3/3258 345/691 |

FOREIGN PATENT DOCUMENTS

| | | |
|---|---|---|
| CN | 201868076 U | 6/2011 |
| CN | 103559860 A | 2/2014 |
| CN | 103854600 A | 6/2014 |
| CN | 103996374 A | 8/2014 |
| CN | 104200785 A | 12/2014 |
| CN | 105845086 A | 8/2016 |

OTHER PUBLICATIONS

Jun. 28, 2017—(WO) International Search Report and Written Opinion Appn PCT/CN2017/085078 with English Tran.
Nov. 17, 2016—(CN) First Office Action Appn 201610378074.8 with English Tran.
Mar. 22, 2016—(CN) Second Office Action Appn 201610378074.8 with English Tran.

* cited by examiner

| Level<br>Serial No. | GL4 | GL3 | GL2 | GL1 | ELVDD |
|---|---|---|---|---|---|
| 1 | 1 | 1 | 1 | 1 | GL4 |
| 2 | 0 | 1 | 1 | 1 | GL3 |
| 3 | 0 | 0 | 1 | 1 | GL2 |
| 4 | 0 | 0 | 0 | 1 | GL1 |

FIG. 4

| Level<br>Serial No. | GL4 | GL3 | GL2 | GL1 | ELVDD |
|---|---|---|---|---|---|
| 1 | 1 | X | X | X | GL4 |
| 2 | 0 | 1 | X | X | GL3 |
| 3 | 0 | 0 | 1 | X | GL2 |
| 4 | 0 | 0 | 0 | 1 | GL1 |

AMOLED DISPLAY DEVICE BASED ELVDD POWER SUPPLY METHOD AND POWER SUPPLY APPARATUS, AND DISPLAY DEVICE

The application is a U.S. National Phase Entry of International Application No. PCT/CN2017/085078 filed on May 19, 2017, designating the United States of America and claiming priority to Chinese Patent Application No. 201610378074.8, filed May 31, 2016. The present application claims priority to and the benefit of the above-identified applications and the above-identified applications are incorporated by reference herein in their entirety.

TECHNICAL FIELD

Embodiments of the present disclosure relate to an AMOLED display device based ELVDD power supply method and power supply apparatus, and a display device.

BACKGROUND

A flat panel display mainly includes a Liquid Crystal Display (LCD) display apparatus and an Organic Light Emitting Display (OLED) display apparatus. The OLED display apparatus can be divided into two types of a Passive Matrix OLED (PMOLED) and an Active Matrix OLED (AMOLED).

SUMMARY

An embodiment of the present disclosure provides an active matrix organic light-emitting diode (AMOLED) display device based ELVDD power supply method, comprising: acquiring a data signal of each pixel in one frame of image; comparing a gray scale value corresponding to the data signal of each pixel with at least two threshold gray scale values; taking a minimum threshold gray scale value in the threshold gray scale values greater than the gray scale value corresponding to the data signal of each pixel as a target gray scale value of the pixel; and taking a maximum target gray scale value in the target gray scale values of all the pixels as a maximum gray scale value of the one frame of image, and driving the one frame of image by an ELVDD corresponding to the maximum gray scale value.

For example, in the method provided by an embodiment of the present disclosure, acquiring the data signal of each pixel in one frame of image includes: reading the data signal of each row of pixels in the one frame of image from a memory.

For example, in the method provided by an embodiment of the present disclosure, comparing the gray scale value corresponding to the data signal of each pixel with at least two threshold gray scale values includes: acquiring a clock period signal; and sequentially comparing the data signals of each row of pixels in the one frame of image with at least two threshold gray scale values according to the clock period signal.

For example, in the method provided by an embodiment of the present disclosure, comparing the gray scale value corresponding to the data signal of each pixel with at least two threshold gray scale values includes: comparing the gray scale value corresponding to the data signal of each pixel with any one threshold gray scale value, and if a gray scale value corresponding to a data signal of a current pixel is greater than or equal to the threshold gray scale value, setting a count value of a counter, which corresponds to the current pixel, as 1; and if the gray scale value corresponding to the data signal of the current pixel is smaller than the threshold gray scale value, setting the count value of the counter, which corresponds to the current pixel, as 0; the method further comprising: acquiring a maximum threshold gray scale value corresponding to the data signal of each pixel by carrying out an OR operation on the count value, which corresponds to each pixel in the one frame of image, of the counter.

For example, in the method provided by an embodiment of the present disclosure, the at least two threshold gray scale values include a first threshold gray scale value, a second threshold gray scale value, a third threshold gray scale value and a fourth threshold gray scale value; the first threshold gray scale value corresponds to a first ELVDD, the second threshold gray scale value corresponds to a second ELVDD, the third threshold gray scale value corresponds to a third ELVDD, and the fourth threshold gray scale value corresponds to a fourth ELVDD; the first threshold gray scale value is smaller than the second threshold gray scale value, the second threshold gray scale value is smaller than the third threshold gray scale value, and the third threshold gray scale value is smaller than the fourth threshold gray scale value; and the first ELVDD is smaller than the second ELVDD, the second ELVDD is smaller than the third ELVDD, and the third ELVDD is smaller than the fourth ELVDD.

An embodiment of the present disclosure provides an ELVDD power supply apparatus, comprising: an acquisition unit, configured to acquire a data signal of each pixel in one frame of image; a processing unit, configured to compare a gray scale value corresponding to the data signal of each pixel with at least two threshold gray scale values, and further configured to use a minimum threshold gray scale value in the threshold gray scale values greater than the gray scale value corresponding to the data signal of each pixel as a target gray scale value of the pixel; and an output unit, configured to use a maximum target gray scale value in the target gray scale values of all the pixels as a maximum gray scale value of the one frame of image, and drive the one frame of image by an ELVDD corresponding to the maximum gray scale value.

For example, the apparatus provided by an embodiment of the present disclosure further comprises a memory; the acquisition unit is configured to: read the data signal of each row of pixels in the one frame of image from the memory.

For example, the apparatus provided by an embodiment of the present disclosure further comprises: a clock unit, configured to provide a clock period signal; the processing unit is further configured to: acquire the clock period signal; and sequentially compare the data signal of each row of pixels in the one frame of image with at least two threshold gray scale values according to the clock period signal.

For example, in the apparatus provided by an embodiment of the present disclosure, the processing unit is configured to: compare the gray scale value corresponding to the data signal of each pixel with any one threshold gray scale value, and if a gray scale value corresponding to a data signal of a current pixel is greater than or equal to the threshold gray scale value, set a count value of a counter, which corresponds to the current pixel, as 1; and if the gray scale value corresponding to the data signal of the current pixel is smaller than the threshold gray scale value, set the count value of the counter, which corresponds to the current pixel, as 0; and acquire a maximum threshold gray scale value corresponding to the data signal of each pixel by carrying out an OR operation on the count value, which corresponds to each pixel in the one frame of image, of the counter.

For example, in the apparatus provided by an embodiment of the present disclosure, the at least two threshold gray scale values include a first threshold gray scale value, a second threshold gray scale value, a third threshold gray scale value and a fourth threshold gray scale value; the first threshold gray scale value corresponds to a first ELVDD, the second threshold gray scale value corresponds to a second ELVDD, the third threshold gray scale value corresponds to a third ELVDD, and the fourth threshold gray scale value corresponds to a fourth ELVDD; the first threshold gray scale value is smaller than the second threshold gray scale value, the second threshold gray scale value is smaller than the third threshold gray scale value, and the third threshold gray scale value is smaller than the fourth threshold gray scale value; and the first ELVDD is smaller than the second ELVDD, the second ELVDD is smaller than the third ELVDD, and the third ELVDD is smaller than the fourth ELVDD.

An embodiment of the present disclosure provides an ELVDD power supply apparatus, comprising: one or more memories; one or more processors; and a computer program code stored in the memory or memories, where the computer program code is executed by the processor or processors, operations below is executed: acquiring a data signal of each pixel in one frame of image; comparing a gray scale value corresponding to the data signal of each pixel with at least two threshold gray scale values; taking a minimum threshold gray scale value in the threshold gray scale values greater than the gray scale value corresponding to the data signal of each pixel as a target gray scale value of the pixel; and taking a maximum target gray scale value in the target gray scale values of all the pixels as a maximum gray scale value of the one frame of image, and driving the one frame of image by an ELVDD corresponding to the maximum gray scale value.

For example, in the apparatus provided by an embodiment of the present disclosure, acquiring the data signal of each pixel in one frame of image includes: reading the data signal of each row of pixels in the one frame of image from the memory or memories.

For example, in the apparatus provided by an embodiment of the present disclosure, comparing the gray scale value of the data signal of each pixel with at least two threshold gray scale values includes: acquiring a clock period signal; and sequentially comparing the data signals of each row of pixels in the one frame of image with at least two threshold gray scale values according to the clock period signal.

For example, in the apparatus provided by an embodiment of the present disclosure, comparing the gray scale value corresponding to the data signal of each pixel with at least two threshold gray scale values includes: comparing the gray scale value corresponding to the data signal of each pixel with any one threshold gray scale value, and if a gray scale value corresponding to a data signal of a current pixel is greater than or equal to the threshold gray scale value, setting a count value of a counter, which corresponds to the current pixel, as 1; and if the gray scale value corresponding to the data signal of the current pixel is smaller than the threshold gray scale value, setting the count value of the counter, which corresponds to the current pixel, as 0; and when the computer program code is executed by the processor or processors, the step below is further executed: acquiring a maximum threshold gray scale value corresponding to the data signal of each pixel by carrying out an OR operation on the count value, which corresponds to each pixel in the one frame of image, of the counter.

For example, in the apparatus provided by an embodiment of the present disclosure, the at least two threshold gray scale values include a first threshold gray scale value, a second threshold gray scale value, a third threshold gray scale value and a fourth threshold gray scale value; the first threshold gray scale value corresponds to a first ELVDD, the second threshold gray scale value corresponds to a second ELVDD, the third threshold gray scale value corresponds to a third ELVDD, and the fourth threshold gray scale value corresponds to a fourth ELVDD; the first threshold gray scale value is smaller than the second threshold gray scale value, the second threshold gray scale value is smaller than the third threshold gray scale value, and the third threshold gray scale value is smaller than the fourth threshold gray scale value; and the first ELVDD is smaller than the second ELVDD, the second ELVDD is smaller than the third ELVDD, and the third ELVDD is smaller than the fourth ELVDD.

An embodiment of the present disclosure provides a display device, comprising: the ELVDD power supply apparatus according to any embodiment of the present disclosure.

BRIEF DESCRIPTION OF THE DRAWINGS

In order to clearly illustrate the technical solution of the embodiments of the disclosure or the prior art, the drawings of the embodiments or description in the prior art will be briefly described in the following. It is obvious that the described drawings are only related to some embodiments of the disclosure, and those skilled in the art also can obtain other drawings, without any inventive work, according to the drawings.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

An electroluminescent (EL) device is relatively low in luminous efficiency, and in order to increase luminous brightness of a display panel, a driving thin film transistor (Driving TFT) is required to enable the EL device to output a large direct current, and a relatively high data voltage needs to be provided for the Driving TFT; when an AMOLED normally works, the Driving TFT works in a saturation region, and a driver integrated circuit needs to supply a very high electroluminescent driving voltage (ELVDD); in consideration of a case that both a critical voltage of the Driving TFT and the data voltage are relatively high, in order to meet the requirement for the maximum data voltage, currently, the ELVDD is provided according to the maximum data voltage without considering other data voltages with relatively low levels, and thus, the ELVDD supplied by the driver integrated circuit and used for driving each frame of image of an AMOLED display device is supplied according to the maximum ELVDD. The ELVDD supplied by the driver integrated circuit is relatively high, and the luminous efficiency of the EL device is still relatively low, and thus, the current passing through the EL device is always a current generated by the maximum ELVDD on the EL device so as to cause high energy consumption of the EL device; and the thermal effect generated by the current increases the calorific value of the EL device so as to cause increase of an aging speed of the EL device and reduce a service life of the EL device.

According to an embodiment of the present disclosure, target gray scale values corresponding to all pixels in one frame of image of an AMOLED display device are found out by comparing data signals of all the pixels of one frame of image of the AMOLED display device with at least two threshold gray scale values, the minimum threshold gray scale value in threshold gray scale values greater than the gray scale value corresponding to the data signal of each of the pixels is used as a target gray scale value of this pixel, the maximum target gray scale value in the target gray scale values of all the pixels is used as a maximum gray scale value of the one frame of image, and the one frame of image is driven by an ELVDD corresponding to the maximum gray scale value so as to change a case that, in the state of art, supply of the ELVDD is determined by the maximum data voltage without considering other relatively low data voltages and then the AMOLED display device is always supplied with the maximum ELVDD; according to requirements of each frame of image of the AMOLED display device, a suitable ELVDD is selected so as to reduce power consumption of the AMOLED display device; and due to flexible change of the ELVDD for driving each frame of image of the AMOLED display device, the calorific value of the EL device is reduced, and the service life of the EL device is prolonged.

Next, illustration will be carried out by way of some specific examples.

Figure 1:
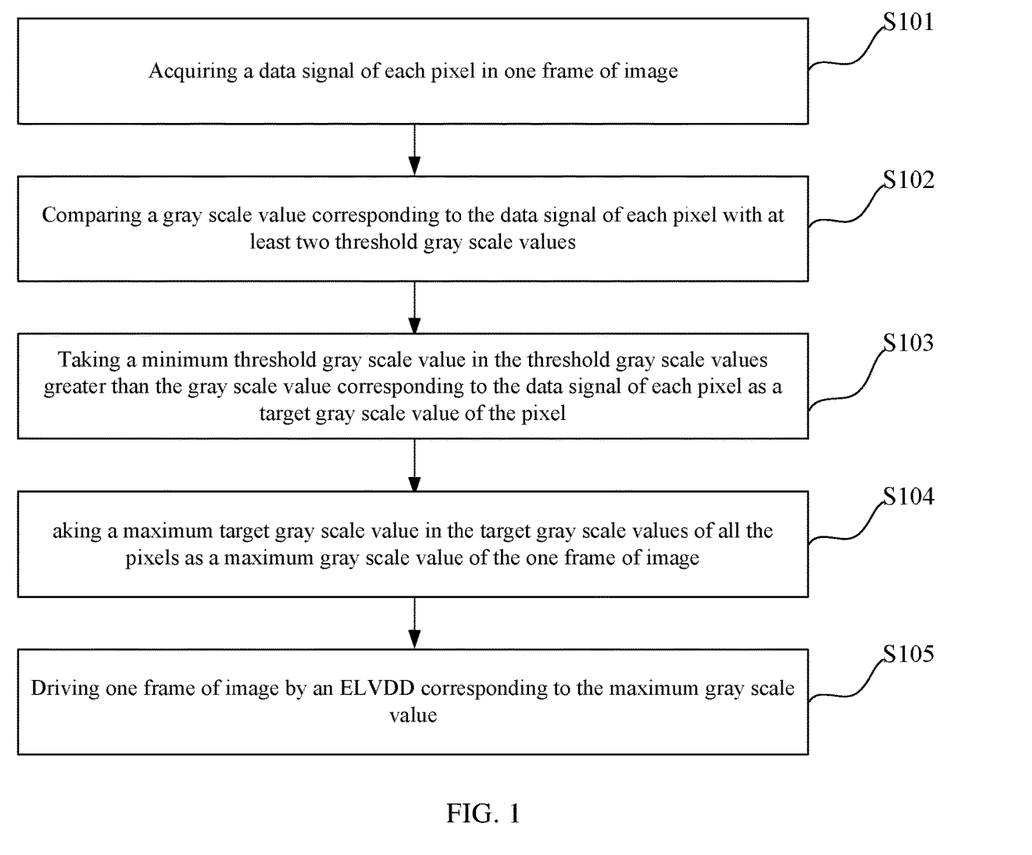
FIG. 1 is a flow schematic diagram of an AMOLED display device based ELVDD power supply method, which is provided by an embodiment of the present disclosure.

For example, an AMOLED display device based ELVDD power supply method, which is provided by an embodiment of the present disclosure, as shown in FIG. 1, includes the following steps:

S101: acquiring a data signal of each pixel in one frame of image.

S102: comparing a gray scale value corresponding to the data signal of each pixel with at least two threshold gray scale values.

S103: taking a minimum threshold gray scale value in the threshold gray scale values greater than the gray scale value corresponding to the data signal of each pixel as a target gray scale value of the pixel.

S104: taking a maximum target gray scale value in the target gray scale values of all the pixels as a maximum gray scale value of the one frame of image.

S105: driving one frame of image by an ELVDD corresponding to the maximum gray scale value.

For example, the data signal of each pixel in one frame of image of the AMOLED display device herein corresponds to one gray scale value, and the gray scale value corresponding to the data signal of each pixel also corresponds to one ELVDD value.

For example, in an embodiment of the present disclosure, firstly, the gray scale values in one frame of image of the AMOLED display device are at least divided into two levels, and by comparing the data signal of one row of pixels in one frame of image with the at least two levels of gray scale values, the proximal gray scale value is selected as the gray scale value level corresponding to the data signal of the row of pixels, so that the data signal of each row of pixels in one frame of image of the AMOLED display device has one corresponding gray scale value; the maximum gray scale level correspondingly in the data signals of all the rows of pixels is used as the gray scale level of one frame of image; and by the maximum gray scale value corresponding to the one frame of image of the AMOLED display device, the ELVDD required for driving the one frame of image is determined. Therefore, the ELVDD corresponding to each frame of image of the AMOLED display device is changed according to difference of each frame of image, and each frame of image of the AMOLED display device does not need to be always driven by the maximum ELVDD, so that power consumption of the AMOLED display device is reduced; and due to flexible change of the ELVDD for driving each frame of image of the AMOLED display device, the calorific value of the EL device is reduced, and the service life of the EL device is prolonged.

Figure 2:
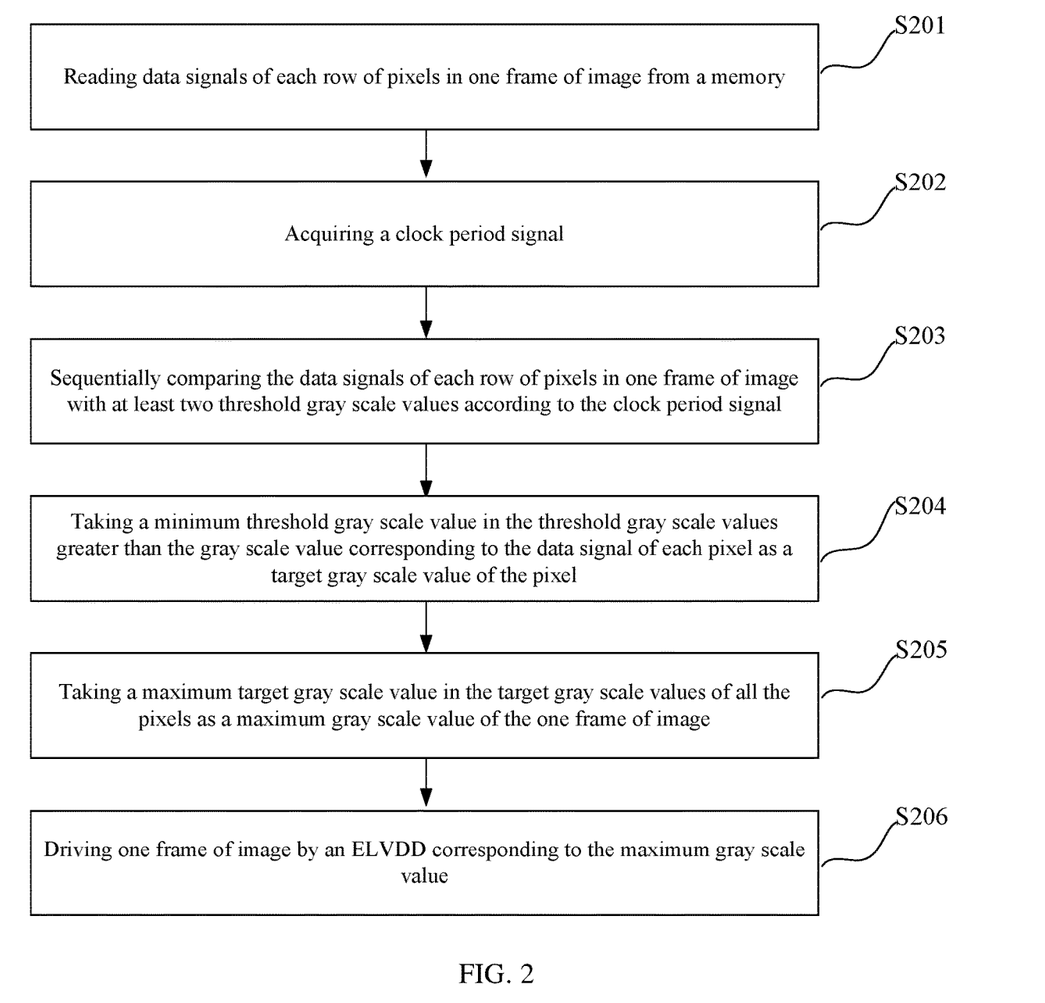
FIG. 2 is a flow schematic diagram of another AMOLED display device based ELVDD power supply method, which is provided by an embodiment of the present disclosure.

For example, an AMOLED display device based ELVDD power supply method, which is provided by an embodiment of the present disclosure, as shown in FIG. 2, includes the following steps:

S201: reading data signals of each row of pixels in one frame of image from a memory.

S202: acquiring a clock period signal.

S203: sequentially comparing the data signals of each row of pixels in one frame of image with at least two threshold gray scale values according to the clock period signal.

S204: taking a minimum threshold gray scale value in the threshold gray scale values greater than the gray scale value corresponding to the data signal of each pixel as a target gray scale value of the pixel.

S205: taking a maximum target gray scale value in the target gray scale values of all the pixels as a maximum gray scale value of the one frame of image.

S206: driving one frame of image by an ELVDD corresponding to the maximum gray scale value.

For example, in an embodiment of the present disclosure, the data signals of each row of pixels in one frame of image are read from the memory, then a clock signal is acquired, and according to the acquired clock signal, the data signals of each pixel row in one frame of image stored in the memory are compared with at least two levels of gray scale values; then the gray scale values corresponding to the data signals of each row of pixels are determined, and a proximal target level gray scale value is used as a gray scale level corresponding to the data signals of each row of pixels, and the gray scale value corresponding to the data signal of each row of pixels is greater than the target level gray scale value, and the target level gray scale value belongs to at least two levels of gray scale values; a corresponding maximum gray scale level in the data signals of all the rows of pixels is used as a gray scale level of one frame of image; and then the ELVDD corresponding to the maximum gray scale level is determined to drive one frame of image.

For example, the clock signal is a signal with a stable frequency, and thus, the data signals of each pixel row in one frame of image stored in the memory is read and compared with at least two levels of gray scale values by control of the clock signal, so that comparison of the data signals of each row of pixels in one frame of image and at least two levels of gray scale values is synchronized. The ELVDD corresponding to each frame of image of the AMOLED display device is changed according to difference of each frame of image, and the AMOLED display device does not need to be always driven by the maximum ELVDD, so that power consumption of the AMOLED display device is reduced; and due to flexible change of the ELVDD for driving each frame of image of the AMOLED display device, the calorific value of the EL device is reduced, and the service life of the EL device is prolonged.

For example, at least two levels of gray scale values include a first threshold gray scale value (a first-level gray scale value), a second threshold gray scale value (a second-level gray scale value), a third threshold gray scale value (a third-level gray scale value), and a fourth threshold gray scale value (a fourth-level gray scale value).

For example, the first threshold gray scale value corresponds to a first ELVDD, the second threshold gray scale value corresponds to a second ELVDD, a third threshold gray scale value corresponds to a third ELVDD, and a fourth threshold gray scale value corresponds to a fourth ELVDD.

For example, the first threshold gray scale value is smaller than the second threshold gray scale value, the second threshold gray scale value is smaller than the third threshold gray scale value, and the third threshold gray scale value is smaller than the fourth threshold gray scale value; and the first ELVDD is smaller than the second ELVDD, the second ELVDD is smaller than the third ELVDD, and the third ELVDD is smaller than the fourth ELVDD.

Figure 3:
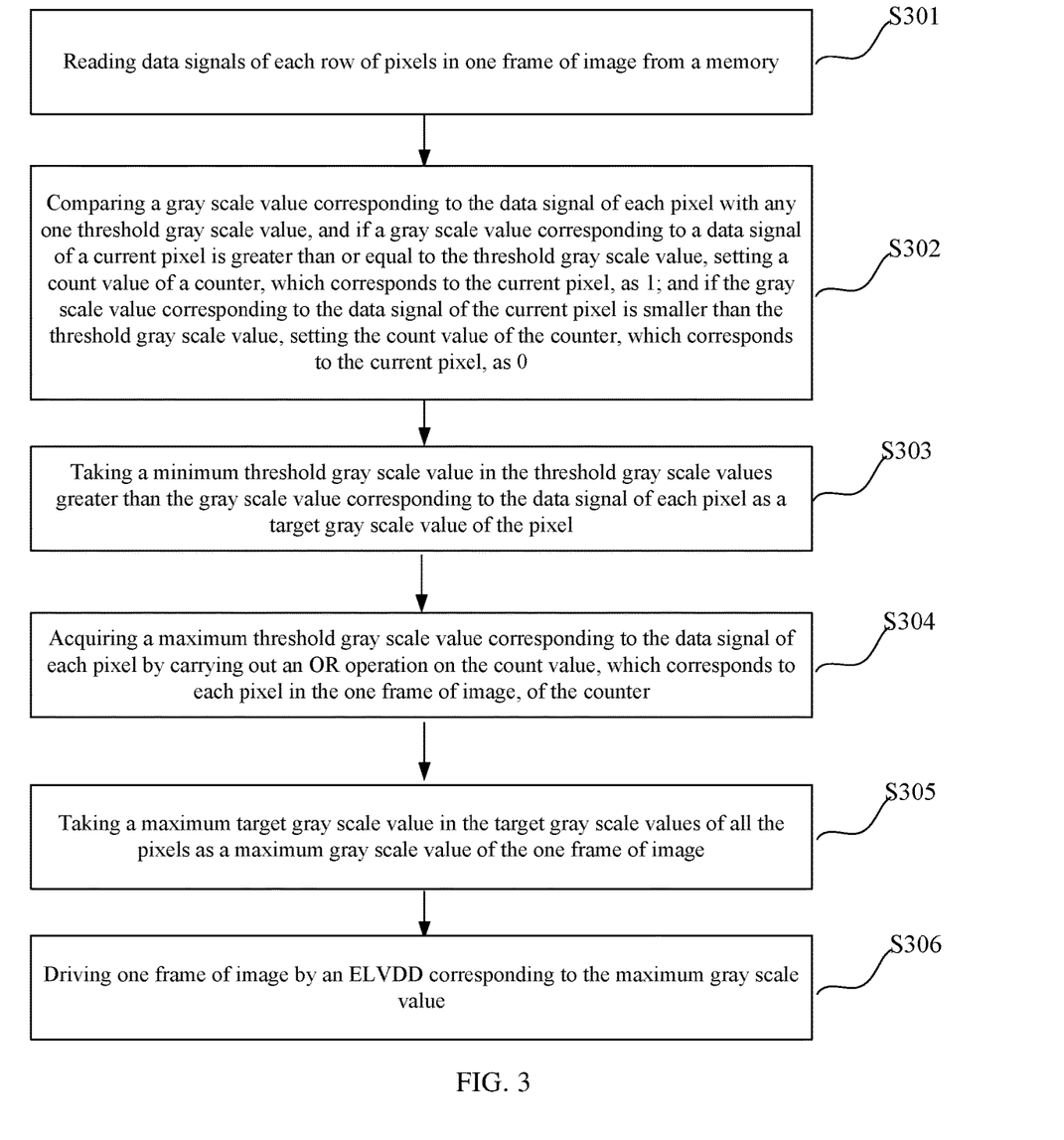
FIG. 3 is a flow schematic diagram of yet another AMOLED display device based ELVDD power supply method, which is provided by an embodiment of the present disclosure.

For example, an embodiment of the present disclosure provides an AMOLED display device based ELVDD power supply method, as shown in FIG. 3, including the following steps:

S301: reading data signals of each row of pixels in one frame of image from a memory.

S302: comparing a gray scale value corresponding to the data signal of each pixel with any one threshold gray scale value, and if a gray scale value corresponding to a data signal of a current pixel is greater than or equal to the threshold gray scale value, setting a count value of a counter, which corresponds to the current pixel, as 1; and if the gray scale value corresponding to the data signal of the current pixel is smaller than the threshold gray scale value, setting the count value of the counter, which corresponds to the current pixel, as 0.

S303: taking a minimum threshold gray scale value in the threshold gray scale values greater than the gray scale value corresponding to the data signal of each pixel as a target gray scale value of the pixel.

The sequence of the step S303 is not limited herein, and the step S303 may also be executed before the step S302.

S304: acquiring a maximum threshold gray scale value corresponding to the data signal of each pixel by carrying out an OR operation on the count value, which corresponds to each pixel in the one frame of image, of the counter.

S305: taking a maximum target gray scale value in the target gray scale values of all the pixels as a maximum gray scale value of the one frame of image.

S306: driving one frame of image by an ELVDD corresponding to the maximum gray scale value.

For example, in the embodiment of the present disclosure, the data signals of each row of pixels in one frame of image are read from the memory, the read data signal of one row of pixels in one frame of image are compared with any one gray scale value, and if the gray scale value corresponding to the data signal of the current pixel is greater than or equal to any one level of gray scale value, the count value of the counter, which corresponds to the current pixel, is set as 1; if the gray scale value corresponding to the data signal of the current pixel is smaller than any one level of gray scale value, the count value of the counter, which corresponds to the current pixel, is set as 0; and comparison results are recorded by the counter, and the result recorded by the counter and corresponding to each row of pixels in one frame of image is subjected to OR operation. OR operation on the results recorded by the counter herein aims to: when the gray scale level of one frame of image is acquired, eliminate pixel rows on which gray scale values corresponding to the data signals of current rows of pixels are smaller than any one level of gray scale value, i.e., eliminate pixel rows with the count values of 0 in the counter, and retain pixel rows on which gray scale values corresponding to the data signals of the current rows of pixels are greater than or equal to any one level of gray scale value, i.e., retain pixel rows with the count values of 1 in the results recorded by the counter; therefore, all pixel rows participating in the gray scale level calculation are acquired, then by step S303, the gray scale values corresponding to the data signals of each row of pixels is determined and the proximal target-level gray scale value is used as the gray scale level corresponding to the data signals of each row of pixels, and finally, in the gray scale levels corresponding to the data signals of all the rows of pixels, the corresponding maximum gray scale level in the data signals of all the rows of pixels is acquired; and then the corresponding maximum gray scale level in the data signals of all the rows of pixels is used as the gray scale level of one frame of image, and one frame of image is driven by the ELVDD corresponding to the maximum gray scale level.

For example, when the counter compares the read data signals of one row of pixels in one frame of image with any one gray scale value, the comparison results are recorded by the counter; then by carrying out an OR operation on the results corresponding to each row of pixels in one frame of image and recorded by the counter, for the gray scale level of one frame of image is acquired, the pixel rows on which the gray scale values corresponding to the data signals of the current rows of pixels are smaller than any one level of gray scale value are eliminated, i.e., the pixel rows with the count values of 0 in the counter are eliminated, so that the number of the pixel rows for searching the maximum gray scale value is reduced, thereby improving the speed of searching the maximum gray scale value; moreover, the ELVDD corresponding to each frame of image of the AMOLED display device is changed according to difference of each frame of image, and the AMOLED display device does not need to be always driven by the maximum ELVDD just like the prior art, so that power consumption of the AMOLED display device is reduced; and due to flexible change of the ELVDD for driving each frame of image of the AMOLED display device, the calorific value of the EL device is reduced, and the service life of the EL device is prolonged.

For example, the AMOLED display device based ELVDD power supply method, which is provided by an embodiment of the present disclosure, is illustrated by taking four levels of gray scale values as an example, and the corresponding ELVDD values are also divided into four levels; and other classification methods are not repeated herein, and the classification methods corresponding to the corresponding gray scale values and ELVDD values shall also fall within the scope of the present disclosure. The judgment basis for comparing the data signals of one row of pixels in one frame of image of the AMOLED display device with four levels of gray scale values is that: the gray scale values corresponding to the data signals of each row of pixels are determined, and the proximal target-level gray scale value is used as the gray scale level corresponding to the data signals of each row of pixels, and the gray scale value corresponding to the data signals of each row of pixels is greater than the target-level gray scale value.

Figure 4:
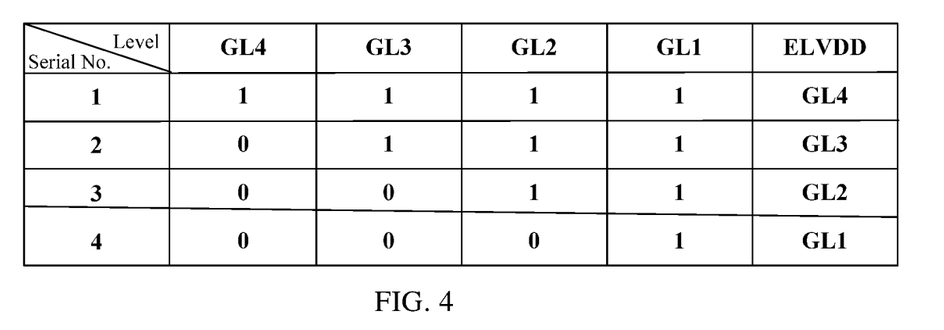
FIG. 4 is a schematic diagram of a truth table of an AMOLED display device based ELVDD comparison method, which is provided by an embodiment of the present disclosure.

For example, as shown in FIG. 4, by taking a method for comparing a data signals of one row of pixels in one frame of image of an AMOLED display device with four levels of gray scale values as an example, the technical solution will be exemplarily illustrated below:

1. When the data signals of one row of pixels in one frame of image of the AMOLED display device are compared with four levels of gray scale values and when the gray scale values corresponding to the data signals are greater than GL1, GL2, GL3 and GL4, due to a case that GL4 is greater than GL3, GL3 is greater than GL2, and GL2 is greater than GL1, from a judgment basis for comparing the data signals of the pixels in one frame of image of the AMOLED display device with four levels of gray scale values, it can be known that a maximum gray scale value of the pixels in one frame of image of the AMOLED display device is GL4, so a level of an ELVDD for driving one frame of image of the AMOLED display device is an ELVDD level corresponding to GL4.

2. When the data signals of the pixels in one frame of image of the AMOLED display device are compared with four levels of gray scale values and when the data signals are greater than GL1, GL2 and GL3 and smaller than GL4, due to a case that GL3 is greater than GL2 and GL2 is greater than GL1, from the judgment basis for comparing the data signals of the pixels in one frame of image of the AMOLED display device with four levels of gray scale values, it can be known that the maximum gray scale value of the pixels in one frame of image of the AMOLED display device is GL3, so the level of the ELVDD for driving one frame of image of the AMOLED display device is an ELVDD level corresponding to GL3.

3. When the data signals of the pixels in one frame of image of the AMOLED display device are compared with four levels of gray scale values and when the data signals are greater than GL1 and GL2 and smaller than GL3 and GL4, due to a case that GL2 is greater than GL1, from the judgment basis for comparing the data signals of the pixels in one frame of image of the AMOLED display device with four levels of gray scale values, it can be known that the maximum gray scale value of the pixels in one frame of image of the AMOLED display device is GL2, so the level of the ELVDD for driving one frame of image of the AMOLED display device is an ELVDD level corresponding to GL2.

4. When the data signals of the pixels in one frame of image of the AMOLED display device are compared with four levels of gray scale values and when the data signals are greater than GL1 and smaller than GL2, GL3 and GL4, from the judgment basis for comparing the data signals of the pixels in one frame of image of the AMOLED display device with four levels of gray scale values, it can be known that the maximum gray scale value of the pixels in one frame of image of the AMOLED display device is GL1, so the level of the ELVDD for driving one frame of image of the AMOLED display device is an ELVDD level corresponding to GL1.

Figure 5:
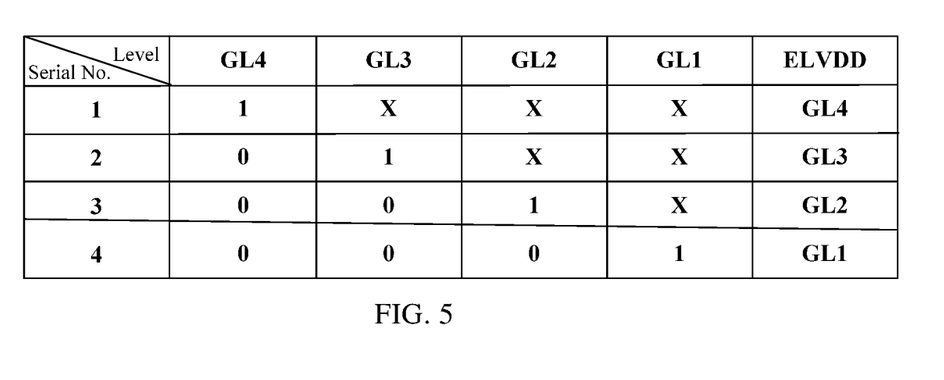
FIG. 5 is a schematic diagram of a truth table of another AMOLED display device based ELVDD comparison method, which is provided by an embodiment of the present disclosure.

For example, as shown in FIG. 5, by taking another method for comparing a data signals of one row of pixels in one frame of image of an AMOLED display device with four levels of gray scale values as an example, it can be known from the technical solution that:

1. When the data signals of the pixels in one frame of image of the AMOLED display device are compared with four levels of gray scale values, and when the data signals are greater than GL4, due to a case that GL4 is greater than GL3, GL3 is greater than GL2 and GL2 is greater than GL1, the data signals do not need to be compared with GL3, GL2 and GL1, and from a judgment basis for comparing the data signals of the pixels in one frame of image of the AMOLED display device with four levels of gray scale values, it can be known that a maximum gray scale value of the pixels in one frame of image of the AMOLED display device is GL4, so a level of an ELVDD for driving one frame of image of the AMOLED display device is an ELVDD level corresponding to GL4.

2. When the data signals of the pixels in one frame of image of the AMOLED display device are compared with four levels of gray scale values, and by taking a case that comparison is started from GL4 according to a sequence from great to small as an example, when the data signals are smaller than GL4 and greater than GL3, due to a case that GL3 is greater than GL2 and GL2 is greater than GL1, the data signals do not need to be compared with GL2 and GL1, and from the judgment basis for comparing the data signals of the pixels in one frame of image of the AMOLED display device with four levels of gray scale values, it can be known that the maximum gray scale value of the pixels in one frame of image of the AMOLED display device is GL3, so a level of the ELVDD for driving one frame of image of the AMOLED display device is an ELVDD level corresponding to GL3.

3. When the data signals of the pixels in one frame of image of the AMOLED display device are compared with at least two levels of gray scale values, and by taking a case that comparison is started from GL4 according to a sequence from great to small as an example, when the data signals are smaller than GL3 and GL4 and greater than GL2, due to a case that GL2 is greater than GL1, the data signals do not need to be compared with GL1, and from the judgment basis for comparing the data signals of the pixels in one frame of image of the AMOLED display device with four levels of gray scale values, it can be known that the maximum gray scale value of the pixels in one frame of image of the AMOLED display device is GL2, so a level of the ELVDD for driving one frame of image of the AMOLED display device is an ELVDD level corresponding to GL2.

4. When the data signals of the pixels in one frame of image of the AMOLED display device are compared with at least two levels of gray scale values, and by taking a case that comparison is started from GL4 according to a sequence from great to small as an example, when the data signal is smaller than GL2, GL3 and GL4 and greater than GL1, from the judgment basis for comparing the data signals of the pixels in one frame of image of the AMOLED display device with four levels of gray scale values, it can be known that the maximum gray scale value of the pixels in one frame of image of the AMOLED display device is GL1, so a level of the ELVDD for driving one frame of image of the AMOLED display device is an ELVDD level corresponding to GL1.

It should be noted that in order to determine comparison results of data signals of the rest of pixels and four levels of gray scale values, any one of the above-mentioned methods can be used for carrying out comparison to determine the gray scale value of the frame of image of the AMOLED display device and the ELVDD corresponding to the gray scale value, and the process of comparing the data signals of one row of pixels in one frame of image of the AMOLED display device with at least two levels of gray scale values is similar to the process of comparing the data signals of one row of pixels in one frame of image of the AMOLED display device with four levels of gray scale values and is not repeated herein.

As described above, according to the AMOLED display device based ELVDD power supply method, which is provided by an embodiment of the present disclosure, firstly, the acquired data signals of each row of pixels in one frame of image of the AMOLED display device are stored into the memory for the data signals of each row of pixels in one frame of image to be read; then, the data signals of each row of pixels in one frame of image in the AMOLED display device are controlled to be compared with at least two levels of gray scale values by the clock signal, and the proximal gray scale value is found out and used as the gray scale value level corresponding to the data signals of the row of pixels, here the gray scale value corresponding to the data signal of each row of pixels is greater than the target-level gray scale value; according to the same method, gray scale values of all rows of pixels in one frame of image of the AMOLED display device are determined so as to find out the maximum gray scale value of the pixel rows in the one frame of image of the AMOLED display device, and the maximum gray scale value is used as the gray scale value of one frame of image of the AMOLED display device; the gray scale value corresponds to the ELVDD so as to determine the ELVDD required for driving the one frame of image of the AMOLED display device; therefore, the AMOLED display device does not need to enable the Driving TFT to be always in an amplification saturation conduction state passively according to one maximum ELVDD, and an AMOLED display device based ELVDD power supply apparatus, which is provided by the present disclosure, can flexibly change the ELVDD of each frame of image of the AMOLED display device according to requirements for the ELVDD of each frame of image, so that power consumption of the AMOLED display device is reduced; and due to flexible change of the ELVDD for driving each frame of image of the AMOLED display device, the calorific value of the EL device is reduced, and the service life of the EL device is prolonged.

Figure 6:
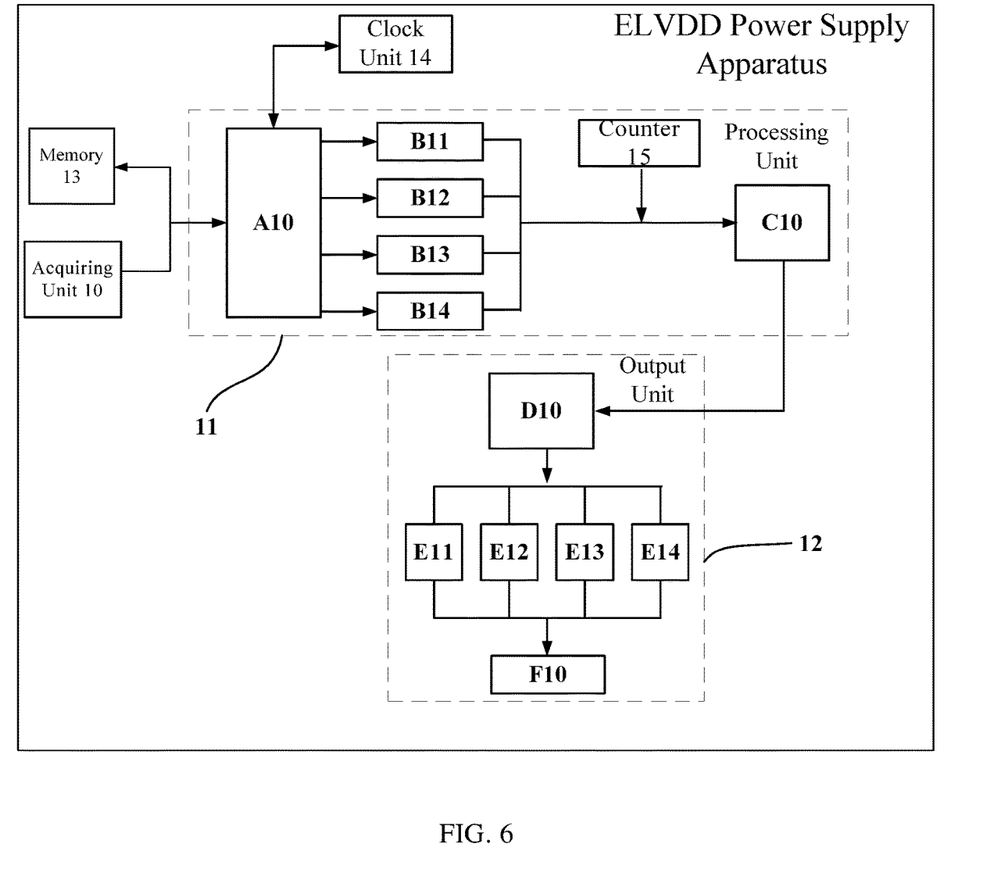
FIG. 6 is a structural schematic diagram of an AMOLED display device based ELVDD power supply apparatus, which is provided by an embodiment of the present disclosure.

An AMOLED display device based ELVDD power supply apparatus, which is provided by an embodiment of the present disclosure, as shown in FIG. 6, includes: an acquisition unit 10, configured to acquire a data signal A10 of each pixel in one frame of image; a processing unit 11, configured to compare a gray scale value corresponding to the data signal A10 of each pixel with at least two threshold gray scale values, and further configured to use a minimum threshold gray scale value in the threshold gray scale values greater than the gray scale value corresponding to the data signal A10 of each pixel as a target gray scale value of the pixel; an output unit 12, configured to use a maximum target gray scale value in the target gray scale values of all the pixels as a maximum gray scale value of the one frame of image, and drive one frame of image by an ELVDD corresponding to the maximum gray scale value.

For example, a corresponding maximum gray scale level for the data signals A10 of all the rows of pixels is used as a gray scale level D10 of one frame of image, and one frame of image is driven by the ELVDD corresponding to the maximum gray scale level.

For example, according to the AMOLED display device based ELVDD power supply apparatus, the data signals of each row of pixels in one frame of image is acquired by the acquisition unit, and then the data signals of each row of pixels in one frame of image, which is obtained by the acquisition unit, are compared with at least two levels of gray scale values by the processing unit so as to determine the level of the gray scale value corresponding to the data signals of a row of pixels, i.e., the gray scale value of the row of pixels; the gray scale value corresponding to the data signals of each row of pixels is greater than a target-level gray scale value; then by using the same method, the gray scale values of all the rows of pixels are determined, and a maximum gray scale value of all rows of pixels in one frame of image is found out to be used as the gray scale value of the one frame of image; and finally, by the output unit, the gray scale value of the one frame of image and the corresponding level of ELVDD are output so as to drive the corresponding frame of image of the AMOLED display device. Therefore, according to the AMOLED display device based ELVDD power supply apparatus, each frame of image of the AMOLED display device does not need to be driven passively according to a maximum ELVDD, but the ELVDD of each frame of image of the AMOLED display device is flexibly changed according to actual demands of one frame of image, and by reducing the ELVDD of the AMOLED display device, power consumption of the AMOLED display device is reduced; and due to flexible change of the ELVDD for driving each frame of image of the AMOLED display device, the calorific value of the EL device is reduced, and the service life of the EL device is prolonged.

For example, an embodiment of the present disclosure provides the AMOLED display device based ELVDD power supply apparatus. As shown in FIG. 6, the power supply apparatus further includes a memory 13, and the acquisition unit 10 is configured to read the data signals A10 of each row of pixels in one frame of image from the memory 13.

For example, an embodiment of the present disclosure provides the AMOLED display device based ELVDD power supply apparatus, as shown in FIG. 6, which further includes a clock unit 14, configured to provide a clock period signal.

The processing unit 11 is configured to acquire the clock period signal and sequentially compare the data signals of each row of pixels in one frame of image with at least two threshold gray scale values according to the clock period signal.

For example, an embodiment of the present disclosure provides the AMOLED display device based ELVDD power supply apparatus, and as shown in FIG. 6, the processing unit 11 is configured to compare the data signal A10 of each pixel with any one gray scale value, compare gray scale values corresponding to data signals of a current row of pixels with any one threshold gray scale value, if the gray scale value corresponding to the data signal of the current pixel is greater than or equal to the threshold gray scale value, set a count value of a counter 15, which corresponds to the current pixel, as 1, and if the gray scale value corresponding to the data signal of the current pixel is smaller than the threshold gray scale value, set the count value of the counter 15, which corresponds to the current pixel, as 0; and acquire a maximum threshold gray scale value corresponding to the data signal of each pixel by carrying out an OR operation on the count value, which corresponds to each pixel in the one frame of image, of the counter.

For example, the counter 15 is used for recording comparison results; and by carrying out an OR operation on the results corresponding to each row of pixels in one frame of image and recorded by the counter 15, the corresponding maximum gray scale level in the data signals A10 of each row of pixels is acquired.

For example, the memory stores the data signals of all rows of pixels of one frame of image in the AMOLED display device, the data signals of all the rows of pixels of one frame of image in the AMOLED display device, which are stored in the memory, are compared with at least two levels of gray scale values one by one in each time period under the control of the clock unit, and by the counter, comparison results of the data signals of all the rows of pixels of one frame of image in the AMOLED display device and at least two levels of gray scale values are recorded; finally, when the gray scale level of one frame of image is acquired by an OR operation, the counter eliminates pixel rows on which gray scale values corresponding to the data signals of current rows of pixels are smaller than any one level of gray scale value, i.e., eliminates pixel rows with the count values of 0 in the counter, and retains pixel rows on which the gray scale values corresponding to the data signals of the current rows of pixels are greater than or equal to any one level of gray scale value, i.e., retains pixel rows with the count values of 1 in the results recorded by the counter; and therefore, the maximum gray scale value in the gray scale values corresponding to all the rows of pixels of one frame of image in the AMOLED display device is determined, and by the processing unit, the maximum gray scale value is used as the gray scale value of the one frame of image of the AMOLED display device.

An embodiment of the present disclosure provides an AMOLED display device based ELVDD power supply apparatus, involving any one AMOLED display device based ELVDD power supply apparatus, which is provided by the embodiments of the present disclosure, and as shown in FIG. 6, at least two levels of gray scale values include a first threshold gray scale value (a first-level gray scale value) B11, a second threshold gray scale value (a second-level gray scale value) B12, a third threshold gray scale value (a third-level gray scale value) B13, and a fourth threshold gray scale value (a fourth-level gray scale value) B14.

For example, the first threshold gray scale value corresponds to a first ELVDD E11, the second threshold gray scale value corresponds to a second ELVDD E12, a third threshold gray scale value corresponds to a third ELVDD E13, and a fourth threshold gray scale value corresponds to a fourth ELVDD E14.

For example, the first threshold gray scale value B11 is smaller than the second threshold gray scale value B12, the second threshold gray scale value B12 is smaller than the third threshold gray scale value B13, and the third threshold gray scale value B13 is smaller than the fourth threshold gray scale value B14; and the first ELVDD E11 is smaller than the second ELVDD E12, the second ELVDD E12 is smaller than the third ELVDD E13, and the third ELVDD E13 is smaller than the fourth ELVDD E14.

It should be noted that the embodiments of the present disclosure take four levels of gray scale values as an example, the ELVDD values corresponding to the four levels of gray scale values are also divided into four levels, the embodiments related to the present disclosure are not limited thereto, and other forms of level distributions shall also fall within the scope of the present disclosure.

For example, according to the present disclosure, by setting different levels of gray level values and the corresponding ELVDD values, the AMOLED display device does not need to drive each frame of image of the AMOLED display device passively by the maximum ELVDD so as to enable the Driving TFT to be always in an amplification saturation conduction state; different frames of images corresponds to different levels of gray scale values, so that the ELVDD required by each frame of image is different in level, and thus, the AMOLED display device based ELVDD power supply apparatus, which is provided by the present disclosure, can change the supply of the ELVDD according to requirements of each frame of image of the AMOLED display device, so that power consumption of the AMOLED display device is reduced; and due to flexible change of the ELVDD for driving each frame of image of the AMOLED display device, the calorific value of the EL device is reduced, and the service life of the EL device is prolonged.

Figure 7:
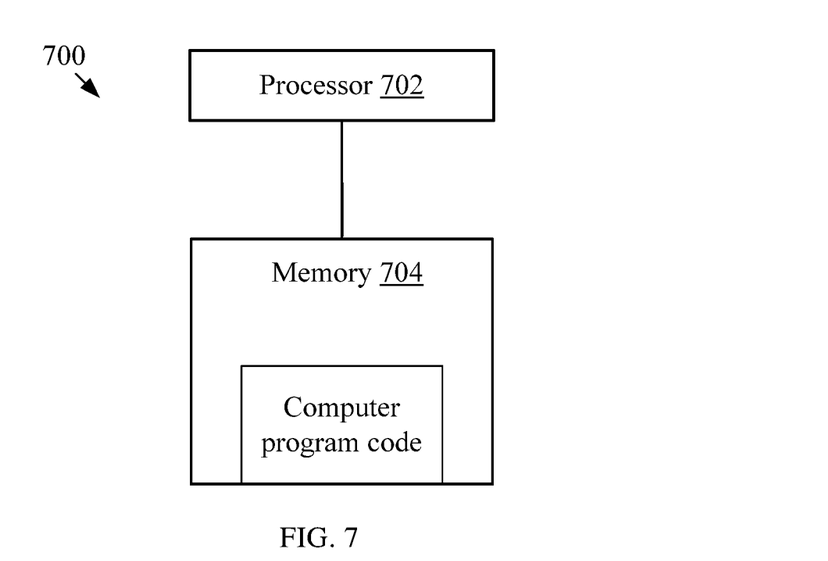
FIG. 7 is a schematic diagram of an AMOLED display device based ELVDD power supply apparatus, which is provided by an embodiment of the present disclosure.

An embodiment of the present disclosure further provides an ELVDD power supply apparatus 700. As shown in FIG. 7, the power supply apparatus 700 includes: one or more memories 702; one or more processors 704; and a computer program code stored in the memory 704. When the computer program code is executed by the processor, the steps below are executed: acquiring a data signal of each pixel in one frame of image; comparing a gray scale value corresponding to the data signal of each pixel with at least two threshold gray scale values; taking a minimum threshold gray scale value in the threshold gray scale values greater than the gray scale value corresponding to the data signal of each pixel as a target gray scale value of the pixel; and taking a maximum target gray scale value in the target gray scale values of all the pixels as a maximum gray scale value of the one frame of image, and driving the one frame of image by an ELVDD corresponding to the maximum gray scale value.

For example, in the apparatus provided by the embodiment of the present disclosure, acquiring the data signal of each pixel in one frame of image includes: reading the data signals of each row of pixels in one frame of image from the memory.

For example, in the apparatus provided by the embodiment of the present disclosure, comparing the gray scale value corresponding to the data signal of each pixel with at least two threshold gray scale values includes: acquiring a clock period signal; and sequentially comparing the data signals of each row of pixels in the one frame of image with at least two threshold gray scale values according to the clock period signal.

For example, in the apparatus provided by the embodiment of the present disclosure, comparing the gray scale value corresponding to the data signal of each pixel with at least two threshold gray scale values includes: comparing the gray scale value corresponding to the data signal of each pixel with any one threshold gray scale value, and if a gray scale value corresponding to a data signal of a current pixel is greater than or equal to the threshold gray scale value, setting a count value of a counter, which corresponds to the current pixel, as 1; and if the gray scale value corresponding to the data signal of the current pixel is smaller than the threshold gray scale value, setting the count value of the counter, which corresponds to the current pixel, as 0; and when the computer program code is executed by the processor, the step below is further executed: acquiring a maximum threshold gray scale value corresponding to the data signal of each pixel by carrying out an OR operation on the count value, which corresponds to each pixel in the one frame of image, of the counter.

For example, in the apparatus provided by the embodiment of the present disclosure, the at least two threshold gray scale values include a first threshold gray scale value, a second threshold gray scale value, a third threshold gray scale value and a fourth threshold gray scale value; the first threshold gray scale value corresponds to a first ELVDD, the second threshold gray scale value corresponds to a second ELVDD, the third threshold gray scale value corresponds to a third ELVDD, and the fourth threshold gray scale value corresponds to a fourth ELVDD; the first threshold gray scale value is smaller than the second threshold gray scale value, the second threshold gray scale value is smaller than the third threshold gray scale value, and the third threshold gray scale value is smaller than the fourth threshold gray scale value; and the first ELVDD is smaller than the second ELVDD, the second ELVDD is smaller than the third ELVDD, and the third ELVDD is smaller than the fourth ELVDD.

For example, the processor 702 may be a Central Processing Unit (CPU) or other forms of processing units with data processing capacity and/or instruction execution capacity, the CPU, for example, may be a single-core or multi-core CPU or the like, for example, may be based on an X86 architecture or an ARM architecture or the like, and for example, may adopt a parallel computing mode or a serial computing mode or the like, and the embodiments of the present disclosure are not limited thereto.

For example, the memory 704 may include one or more computer program products, the computer program products may include various forms of computer readable storage media, e.g., a volatile memory and/or a nonvolatile memory. The volatile memory, for example, may include a Random Access Memory (RAM) and/or a high-speed cache and the like. The nonvolatile memory, for example, may include a Read Only Memory (ROM), a hard disk, a flash memory and the like. One or more computer program codes can be stored on the computer readable storage medium, and the processor 702 may operate the program codes to achieve functions (which are achieved by the processor) in the embodiments of the present disclosure and/or other expected functions. Various applications and various data, e.g., font images, various data used and/or generated by the applications and the like, can also be stored in the computer readable storage medium.

Figure 8:
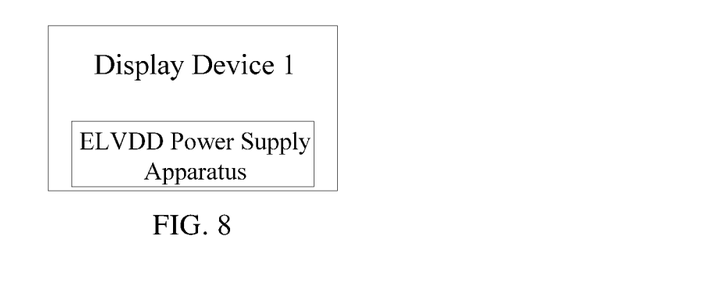
FIG. 8 is a schematic diagram of a display device provided by an embodiment of the present disclosure.

An embodiment of the present disclosure provides a display device 1. As shown in FIG. 8, the display device 1 includes any ELVDD power supply apparatus in the above embodiments. For example, the display device may be any product or part with a display function, such as electronic paper, a mobile phone, a tablet personal computer, a television, a display, a notebook computer, a digital photo frame, a navigator and the like.

Although detailed description has been given above to the present disclosure with reference to general description and preferred embodiment, it is apparent to those skilled in the art that some modifications or improvements may be made on the basis of the embodiments of the present disclosure. Therefore, the modifications or improvements made without departing from the spirit of the present disclosure shall all fall within the scope of protection of the present disclosure.

The application claims priority to the Chinese patent application No. 201610378074.8, filed May 31, 2016, the entire disclosure of which is incorporated herein by reference as part of the present application.

What is claimed is:

1. An active matrix organic light-emitting diode (AMOLED) display device based electroluminescent driving voltage (ELVDD) power supply method, comprising:
   acquiring a data signal of each pixel in one frame of image;
   comparing a gray scale value corresponding to the data signal of each pixel with at least two threshold gray scale values;
   taking a minimum threshold gray scale value in the threshold gray scale values greater than the gray scale value corresponding to the data signal of each pixel as a target gray scale value of the pixel; and
   taking a maximum target gray scale value in the target gray scale values of all pixels as a maximum gray scale value of the one frame of image, and
   driving the one frame of image by an ELVDD corresponding to the maximum gray scale value, wherein
   the comparing the gray scale value corresponding to the data signal of each pixel with the at least two threshold gray scale values includes:
   comparing the gray scale value corresponding to the data signal of each pixel with any one threshold gray scale value, and if a gray scale value corresponding to a data signal of a current pixel is greater than or equal to the threshold gray scale value, setting a count value of a counter, which corresponds to the current pixel, as 1; and if the gray scale value corresponding to the data signal of the current pixel is smaller than the threshold gray scale value, setting the count value of the counter, which corresponds to the current pixel, as 0; and
   the method further comprises: acquiring a maximum threshold gray scale value corresponding to the data signal of each pixel by carrying out an OR operation on the count value, which corresponds to each pixel in the one frame of image, of the counter with the 1 and the 0 as logical values, wherein the acquiring the maximum threshold gray scale value corresponding to the data signal of each pixel by carrying out the OR operation on the count value, which corresponds to each pixel in the one frame of image, of the counter with the 1 and the 0 as logical values further comprises:

carrying out the OR operation on the count value, which corresponds to each pixel in each row of pixels in the one frame of image, of the counter with the 1 and the 0 as logical values, so as to eliminate a row of pixels with the count values of 0 in the counters corresponding to all pixels of the row of pixels.

2. The method according to claim 1, wherein the acquiring the data signal of each pixel in the one frame of image includes:

reading data signals of each row of pixels in the one frame of image from a memory.

3. The method according to claim 1, wherein the comparing the gray scale value corresponding to the data signal of each pixel with the at least two threshold gray scale values includes:

acquiring a clock period signal; and sequentially comparing data signals of each row of pixels in the one frame of image with the at least two threshold gray scale values according to the clock period signal.

4. The method according to claim 1, wherein the at least two threshold gray scale values include a first threshold gray scale value, a second threshold gray scale value, a third threshold gray scale value, and a fourth threshold gray scale value;

the first threshold gray scale value corresponds to a first ELVDD, the second threshold gray scale value corresponds to a second ELVDD, the third threshold gray scale value corresponds to a third ELVDD, and the fourth threshold gray scale value corresponds to a fourth ELVDD;

the first threshold gray scale value is smaller than the second threshold gray scale value, the second threshold gray scale value is smaller than the third threshold gray scale value, and the third threshold gray scale value is smaller than the fourth threshold gray scale value; and the first ELVDD is smaller than the second ELVDD, the second ELVDD is smaller than the third ELVDD, and the third ELVDD is smaller than the fourth ELVDD.

5. An electroluminescent driving voltage (ELVDD) power supply apparatus, comprising:

an acquisition unit, configured to acquire a data signal of each pixel in one frame of image;

a processing unit, configured to compare a gray scale value corresponding to the data signal of each pixel with at least two threshold gray scale values, and further configured to use a minimum threshold gray scale value in the threshold gray scale values greater than the gray scale value corresponding to the data signal of each pixel as a target gray scale value of the pixel; and an output unit, configured to use a maximum target gray scale value in the target gray scale values of all pixels as a maximum gray scale value of the one frame of image, and drive the one frame of image by an ELVDD corresponding to the maximum gray scale value, wherein the processing unit is further configured to:

compare the gray scale value corresponding to the data signal of each pixel with any one threshold gray scale value, and if a gray scale value corresponding to a data signal of a current pixel is greater than or equal to the threshold gray scale value, set a count value of a counter, which corresponds to the current pixel, as 1; and if the gray scale value corresponding to the data signal of the current pixel is smaller than the threshold gray scale value, set the count value of the counter, which corresponds to the current pixel, as 0; and acquire a maximum threshold gray scale value corresponding to the data signal of each pixel by carrying out an OR operation on the count value, which corresponds to each pixel in the one frame of image, of the counter with the 1 and the 0 as logical values; wherein the processing unit is further configured to: carry out the OR operation on the count value, which corresponds to each pixel in each row of pixels in the one frame of image, of the counter with the 1 and the 0 as logical values, so as to eliminate a row of pixels with the count values of 0 in the counters corresponding to all pixels of the row of pixels.

6. The apparatus according to claim 5, further comprising a memory, wherein the acquisition unit is further configured to read data signals of each row of pixels in the one frame of image from the memory.

7. The apparatus according to claim 5, further comprising: a clock unit, configured to provide a clock period signal, wherein the processing unit is further configured to:

acquire the clock period signal; and sequentially compare data signals of each row of pixels in the one frame of image with the at least two threshold gray scale values according to the clock period signal.

8. The apparatus according to claim 5, wherein the at least two threshold gray scale values include a first threshold gray scale value, a second threshold gray scale value, a third threshold gray scale value, and a fourth threshold gray scale value;

the first threshold gray scale value corresponds to a first ELVDD, the second threshold gray scale value corresponds to a second ELVDD, the third threshold gray scale value corresponds to a third ELVDD, and the fourth threshold gray scale value corresponds to a fourth ELVDD;

the first threshold gray scale value is smaller than the second threshold gray scale value, the second threshold gray scale value is smaller than the third threshold gray scale value, and the third threshold gray scale value is smaller than the fourth threshold gray scale value; and the first ELVDD is smaller than the second ELVDD, the second ELVDD is smaller than the third ELVDD, and the third ELVDD is smaller than the fourth ELVDD.

9. A display device, comprising the ELVDD power supply apparatus according to claim 5.

10. An electroluminescent driving voltage (ELVDD) power supply apparatus, comprising:

one or more memories;

one or more processors; and a computer program code stored in the one or more memories, wherein the computer program code, when executed by the one or more processors, causes the apparatus to:

acquire a data signal of each pixel in one frame of image;

compare a gray scale value corresponding to the data signal of each pixel with at least two threshold gray scale values;

take a minimum threshold gray scale value in the threshold gray scale values greater than the gray scale value corresponding to the data signal of each pixel as a target gray scale value of the pixel; and take a maximum target gray scale value in the target gray scale values of all pixels as a maximum gray scale value of the one frame of image, and driving the one frame of image by an ELVDD corresponding to the maximum gray scale value, wherein the computer program code, when executed by the one or more processors, further causes the apparatus to compare the gray scale value corresponding to the data signal of each pixel with the at least two threshold gray scale values by causing the apparatus to: compare the gray scale value corresponding to the data signal of each pixel with any one threshold gray scale value, and if a gray scale value corresponding to a data signal of a current pixel is greater than or equal to the threshold gray scale value, set a count value of a counter, which corresponds to the current pixel, as 1; and if the gray scale value corresponding to the data signal of the current pixel is smaller than the threshold gray scale value, set the count value of the counter, which corresponds to the current pixel, as 0; and wherein the computer program code, when executed by the one or more processors, further causes the apparatus to: acquire a maximum threshold gray scale value corresponding to the data signal of each pixel by carrying out an OR operation on the count value, which corresponds to each pixel in the one frame of image, of the counter with the 1 and the 0 as logical values; wherein the computer program code, when executed by the one or more processors, further causes the apparatus to: carry out the OR operation on the count value, which corresponds to each pixel in each row of pixels in the one frame of image, of the counter with the 1 and the 0 as logical values, so as to eliminate a row of pixels with the count values of 0 in the counters corresponding to all pixels of the row of pixels.

11. The apparatus according to claim 10, wherein the computer program code, when executed by the one or more processors, causes the apparatus to acquire the data signal of each pixel in the one frame of image by causing the apparatus to:

read data signals of each row of pixels in the one frame of image from the one or more memories.

12. The apparatus according to claim 10, wherein the computer program code, when executed by the one or more processors, causes the apparatus to compare the gray scale value corresponding to the data signal of each pixel with the at least two threshold gray scale values by causing the apparatus to:

acquire a clock period signal; and sequentially compare data signals of each row of pixels in the one frame of image with the at least two threshold gray scale values according to the clock period signal.

13. The apparatus according to claim 10, wherein the at least two threshold gray scale values include a first threshold gray scale value, a second threshold gray scale value, a third threshold gray scale value, and a fourth threshold gray scale value;

the first threshold gray scale value corresponds to a first ELVDD, the second threshold gray scale value corresponds to a second ELVDD, the third threshold gray scale value corresponds to a third ELVDD, and the fourth threshold gray scale value corresponds to a fourth ELVDD;

the first threshold gray scale value is smaller than the second threshold gray scale value, the second threshold gray scale value is smaller than the third threshold gray scale value, and the third threshold gray scale value is smaller than the fourth threshold gray scale value; and the first ELVDD is smaller than the second ELVDD, the second ELVDD is smaller than the third ELVDD, and the third ELVDD is smaller than the fourth ELVDD.

* * * * *

UNITED STATES PATENT AND TRADEMARK OFFICE
CERTIFICATE OF CORRECTION

PATENT NO. : 10,741,120 B2
APPLICATION NO. : 15/567834
DATED : August 11, 2020
INVENTOR(S) : Chen It is certified that error appears in the above-identified patent and that said Letters Patent is hereby corrected as shown below:

On the Title Page

Item (73) Assignee, Column 1, Line 1:
Delete "BOE Technology Group Co, Ltd.," and insert --BOE Technology Group Co., Ltd.,--

Signed and Sealed this
Ninth Day of February, 2021

Drew Hirshfeld
*Performing the Functions and Duties of the*
*Under Secretary of Commerce for Intellectual Property and*
*Director of the United States Patent and Trademark Office*